(12) United States Patent
Strohmayer

(10) Patent No.: US 6,965,660 B2
(45) Date of Patent: Nov. 15, 2005

(54) DIGITAL PHASE-LOCKED LOOP

(75) Inventor: Klaus Strohmayer, Graz (AT)

(73) Assignee: Infineon Technologies AG, München (DE)

( * ) Notice: Subject to any disclaimer, the term of this patent is extended or adjusted under 35 U.S.C. 154(b) by 602 days.

(21) Appl. No.: 09/969,269

(22) Filed: Sep. 28, 2001

(65) Prior Publication Data

US 2002/0071512 A1 Jun. 13, 2002

(30) Foreign Application Priority Data

Oct. 5, 2000 (DE) .............................. 100 49 333

(51) Int. Cl.⁷ ............................................. H03D 3/24
(52) U.S. Cl. ................. 375/376; 375/240.28; 375/376; 375/374
(58) Field of Search ............................. 331/1 A, 2, 11, 331/14, 1; 375/376, 374, 240.28; 359/158; 327/158, 105; 360/32

(56) References Cited

U.S. PATENT DOCUMENTS

| | | | |
|---|---|---|---|
| 4,057,768 A * | 11/1977 | Juliusburger et al. ....... | 331/1 A |
| 4,290,029 A | 9/1981 | Streckenbach | |
| 4,351,002 A * | 9/1982 | Decraemer et al. ......... | 348/540 |
| 4,914,404 A * | 4/1990 | Ernst ........................... | 331/11 |
| 5,142,420 A * | 8/1992 | Tanaka et al. ................ | 360/32 |
| 5,334,952 A * | 8/1994 | Maddy et al. ............... | 331/1 A |
| 6,052,034 A * | 4/2000 | Wang et al. ................... | 331/2 |
| 6,078,633 A * | 6/2000 | Shiotsu et al. .............. | 375/374 |
| 6,259,328 B1 * | 7/2001 | Wesolowski ................. | 331/14 |
| 6,404,247 B1 * | 6/2002 | Wang ........................ | 327/158 |
| 6,754,280 B2 * | 6/2004 | Nguyen ................. | 375/240.28 |
| 2002/0008589 A1 * | 1/2002 | Lanoman et al. ............. | 331/34 |

FOREIGN PATENT DOCUMENTS

DE   2856211   3/1980

OTHER PUBLICATIONS

Walters et al., " Digital Phase-Locked Loop with Jitter Bounded," *IEEE Transactions on Circuits and Systems*, vol. 36, No. 7, Jul. 1989, pp. 980-986.

* cited by examiner

*Primary Examiner*—Stephen Chin
*Assistant Examiner*—Linda Wong
(74) *Attorney, Agent, or Firm*—Jenkins, Wilson & Taylor, P.A.

(57) ABSTRACT

A digital phase-locked loop is provided having a minimal transient recovery time for emitting an output clock signal which is synchronous with a reference clock signal in a normal operating state of the digital phase-locked loop. The phase-locked loop can include a phase detector for identifying a phase deviation between the reference clock signal and a feedback clock signal. Further, the phase-locked loop can include a resettable counter, which generates a digital phase deviation signal corresponding to the identified phase deviation. The phase-locked loop can also include a resettable digital filter for filtering the digital phase deviation signal. Further, the phase-locked loop can include an oscillator circuit for generating the output clock signal as a function of a filtered digital phase deviation signal. The phase-locked loop can also include a resettable feedback frequency divider which divides the output clock signal for generating the feedback clock signal.

14 Claims, 3 Drawing Sheets

DIGITAL PHASE-LOCKED LOOP

TECHNICAL FIELD

The invention relates to a digital phase-locked loop having a minimal transient recovery time for transient recovery to a reset state.

RELATED ART

Phase-locked loops or PLL circuits are circuits for the frequency and phase synchronization of two signal oscillations of, in particular, clock signals. PLL circuits of digital construction are increasingly being used in this case.

FIG. 1 shows a digital PLL circuit according to the prior art. The PLL circuit has a first clock signal input E1 for receiving a high-frequency counter clock signal $f_{clock}$ and a second signal input E2 for receiving a reference clock signal having the frequency $f_{ref}$. The PLL circuit contains a phase detector which detects the phase deviation $\Delta\Phi$ between the reference clock signal present at the input E2 and a feedback signal present at an output of a feedback frequency divider. As a function of the detected phase deviation $\Delta\Phi$, the phase detector emits a control signal for controlling a digital counter, which is clocked by the counter clock signal with the counter clock frequency $f_{clock}$. In this case, the counter clock frequency $f_{clock}$ is about 100 MHz, for example. By contrast, the frequency $f_{ref}$ of the reference clock signal is a few kHz.

The counter emits a digital data value D via data lines, the digital data value D corresponding to the detected phase deviation. The digital phase deviation value D is filtered by a digital filter. The filter is a digital low-pass filter. The filtered phase deviation value is emitted to a digitally controlled oscillator circuit DCO (DCO: Digital Controlled Oscillator), which emits an output clock signal at a signal output A1 of the digital PLL circuit. In normal operation of the digital PLL circuit, the output clock signal emitted at the output A1 is synchronous with the reference clock signal having the frequency $f_{ref}$ which is present at the input E2. In this case, the output clock frequency $f_{out}$ is generally a multiple of the input clock frequency $f_{ref}$. The output clock signal furthermore passes to an input of a feedback frequency divider, which divides the frequency $f_{out}$ of the output clock signal with an adjustable frequency ratio k and, at its output, emits a feedback clock signal to the phase detector.

The PLL circuit according to the prior art, as is illustrated in FIG. 1, furthermore contains a lock detection circuit, which emits a logical indication signal via a signal output A2 if the digital phase deviation value D is zero and the PLL circuit is thus locked to the input reference frequency.

The phase detector, the counter, the digital filter, the lock detection circuit and also the feedback frequency divider are connected to a reset terminal R of the digital PLL circuit via reset lines. When the digital PLL circuit is switched on, the phase detector, the counter, the digital filter, the lock detection circuit and also the feedback frequency divider receive a global reset signal via the reset lines, by means of which these circuit sections of the digital PLL circuit are reset into a predefined reset state or initial state. After the switch-on and consequent resetting of the phase detector, counter, digital filter, lock detection circuit and feedback frequency divider, there is an indefinite phase difference $\Delta\Phi$ between the reference clock signal and the feedback clock signal, i.e. the two signals are asynchronous with respect to one another. The digital phase-locked loop or the digital PLL circuit reduces this phase deviation $\Delta\Phi$ in a transient process until the digital phase deviation value D at the output of the counter is zero and the lock detection circuit indicates the end of the transient recovery time. The digital oscillator circuit DCO of the digital phase-locked loop has a lower cut-off frequency $f_1$ and an upper cut-off frequency $f_u$, where $$f_1 \leq f_{out} \leq f_u \tag{1}$$

The difference between the upper and lower cut-off frequencies $\Delta f_{DCO}$ is also referred to as the pulling range or frequency pulling range of the digitally controlled oscillator circuit DCO:

$$\Delta f_{DCO} = f_u - f_{low} \tag{2}$$

The phase deviation $\Delta\Phi$ determined by the phase detector is the phase difference between the phase of the reference clock signal at the input E2 and the phase of the feedback clock signal at the output of the feedback frequency divider $$\Delta\Phi = \Phi_{ref} - \Phi_{fb} \tag{3}$$

where $\Phi_{ref}$ is the phase of the reference clock signal and $\Phi_{fb}$ is the phase of the feedback clock signal.

The duration of the transient process, $T_{transient}$, in the PLL circuit according to the prior art as illustrated in FIG. 1 is longer, the higher the original phase deviation $\Delta\Phi$ between the reference clock signal and the feedback clock signal. The maximum phase deviation $\Delta\Phi_{max}$ is 180°. The transient recovery time of the PLL circuit is longer, the higher the frequency division ratio k of the feedback frequency divider and the smaller the frequency pulling range $\Delta f_{DCO}$ of the digital oscillator circuit DCO. Given the reference frequency $f_{ref}$ of a few kHz and given a frequency division ratio k of 1024, given a counter clock frequency of about 100 MHz, an upper cut-off frequency $f_u$ of the DCO of 8.19268 MHz and a lower cut-off frequency $f_1$ of 8.19147 MHz, the required transient recovery time $T_{tr}$ for the compensation of a maximum phase error $\Delta\Phi_{max}$ of 180°, in the conventional phase-locked loop according to the prior art as is illustrated in FIG. 1, is about 2 seconds on account of the small frequency pulling range.

In many applications, such a long transient recovery time of the digital phase-locked loop after the switch-on is unacceptable.

SUMMARY OF THE INVENTION

The object of the present invention, therefore, is to provide a digital phase-locked loop which has a minimal transient recovery time.

This object is achieved according to the invention by means of a digital phase-locked loop having the features specified in patent claim 1.

The invention provides a digital phase-locked loop having a minimal transient recovery time for emitting an output clock signal which is synchronous with a reference clock signal in a normal operating state of the digital phase-locked loop, the digital phase-locked loop having:

a phase detector for identifying a phase deviation between the reference clock signal and a feedback clock signal, a resettable counter, which generates a digital phase deviation signal corresponding to the identified phase deviation, a resettable digital filter for digitally filtering the digital phase deviation signal generated, a digitally controlled oscillator circuit for generating the output clock signal as a function of the filtered digital phase deviation signal, and a resettable feedback frequency divider, which divides the output clock signal for generating the feedback clock signal with an adjustable frequency division ratio, the digital phase-locked loop additionally containing an integrated reset circuit, which resets the counter, the digital filter and the feedback frequency divider if the digital phase deviation signal exceeds an adjustable digital threshold value.

The reset circuit of the digital phase-locked loop according to the invention preferably deactivates a reset state—caused by a global reset signal—of the counter, of the digital filter and of the feedback frequency divider when a signal edge of the reference clock signal occurs.

The counter, the digital filter and the feedback frequency divider are preferably put into the reset state by the global reset signal when the digital phase-locked loop is switched on.

In a preferred embodiment of the digital phase-locked loop according to the invention, the reset circuit integrated therein is itself reset by the global reset signal.

The reset circuit preferably has a digital comparator circuit for comparing the digital phase deviation signal with the digital threshold value set.

Furthermore, the reset circuit preferably has an edge-triggered flip-flop with a data input, which is connected to the digital comparator circuit, a clock input for receiving the reference clock signal, a reset input for receiving the global reset signal, and with a data output.

Furthermore, the digital phase-locked loop preferably contains a logic OR gate having a first input, which is connected to the data output of the edge-triggered flip-flop, a second input, which is connected to a reset input of the digital phase-locked loop for receiving the global reset signal, and having an output, which is connected to the reset signal terminals of the counter, of the digital filter and of the feedback frequency divider.

In a further preferred embodiment of the digital phase-locked loop according to the invention, said phase-locked loop additionally contains a resettable lock detection circuit, which indicates the end of the transient process by emitting a logical indication signal if the digital phase deviation signal is essentially zero.

In this case, the resettable lock detection circuit likewise has a reset signal terminal, which is connected to the signal output of the logic OR gate.

Furthermore, the digital phase-locked loop preferably has a reference clock generator for generating a reference clock signal.

In a further preferred embodiment of the phase-locked loop according to the invention, the reset circuit deactivates the reset state when a rising or a falling signal edge of the reference clock signal occurs.

In a particularly preferred embodiment of the digital phase-looked loop according to the invention, the digital filter is a digital low-pass filter.

In this case, the digital low-pass filter is preferably a digital IIR low-pass filter.

In a preferred embodiment, the counter is clocked by a high-frequency counter clock signal.

Preferred embodiments of the digital phase-locked loop according to the invention are described below with reference to the accompanying figures for the purpose of elucidating features that are essential to the invention.

In the figures:

DETAILED DESCRIPTION OF THE INVENTION

Figure 2:
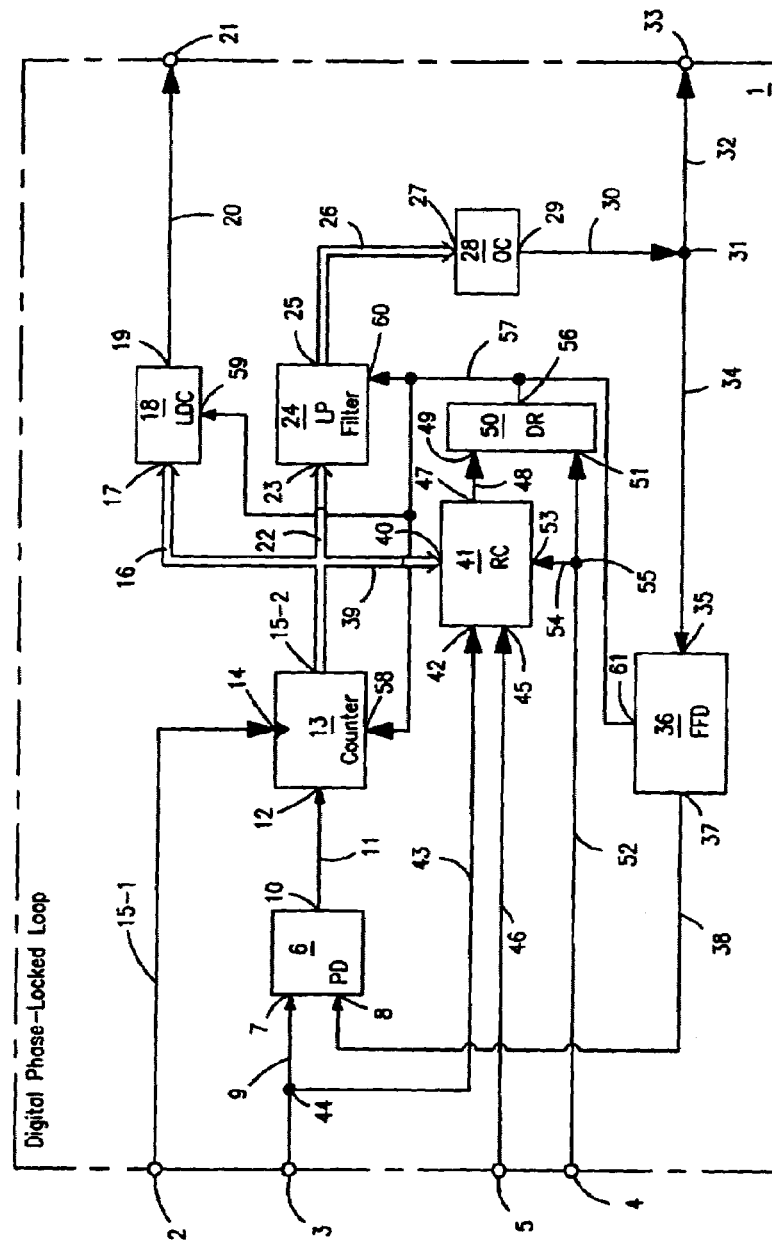
FIG. 2 shows a digital phase-locked loop in accordance with a preferred embodiment of the present invention.

As can be discerned from FIG. 2, the digital phase-locked loop 1 according to the invention has a counter clock input 2 for application of a high-frequency counter clock signal. A reference clock signal is applied to a further signal input 3 of the digital phase-locked loop 1. Furthermore, the digital phase-locked loop 1 has a reset terminal 4 for application of a global reset signal, and preferably a setting terminal 5 for setting a digital threshold value. The phase-locked loop 1 contains a phase detector 6 for identifying a phase deviation between the reference clock signal present at the signal input 3 and a feedback clock signal. For this purpose, the phase detector 6 has a first signal input 7 and a second signal input 8, the first signal input 7 being connected to the input 3 of the phase-locked loop 1 via a line 9. The phase detector 6 has a signal output 10, which is connected to a signal input 12 of a counter 13 via a line 11.

The counter 13 is preferably an up/down counter which receives a counter control signal via the line 11. The counter 13 is clocked by the high-frequency counter clock signal, which is present at the signal input 2 of the phase-locked loop 1, via a clock signal input 14 and a clock line 15-1. The counter 13 has a digital data output 15-2, via which it emits a phase deviation data word D having a width of a plurality of bits. In a preferred embodiment of the digital phase-locked loop 1 according to the invention, the digital data word emitted by the counter 13 has a width of 10 bits. The data value emitted at the counter output 15-2 of the counter 13 corresponds to the phase deviation $\Delta\Phi$—detected by the phase detector—between the reference clock signal and the feedback clock signal which is present at the signal input 8 of the phase detector 6.

The digital data output 15-2 of the counter 13 is connected to the signal input 17 of a lock detection circuit 18 via data lines 16. The lock detection circuit 18 has a signal output 19, which is connected to a first signal output 21 of the digital phase-locked loop 1 via a line 20. The lock detection circuit 18 detects, via the digital lines 16, the digital phase deviation signal D present at the data output 15-2 of the counter 13 and emits a logical indication signal via the line 20 if the phase deviation value D is zero. The indication signal emitted by the look detection circuit 18 indicates that the digital phase-locked loop is in the normal operating state and the transient process has ended.

The digital data output 15-2 of the counter 13 is connected to a signal input 23 of a digital low-pass filter 24 via data lines 22. The digital low-pass filter 24 is preferably a digital IIR low-pass filter (IIR: Infinite Impulse Response). The digital low-pass filter 24 has a signal output 25, via which the digital low-pass filter 24 emits the filtered digital phase deviation signal via lines 26 to a signal input 27 of a digitally controlled oscillator circuit 28.

The digitally controlled oscillator circuit or DCO circuit (DCO: Digital Controlled Oscillator) generates an output clock signal as a function of the filtered digital phase deviation signal, which output clock signal is emitted via a signal output 29 of the oscillator circuit 28. The output clock signal generated passes via a line 30 to a branching node 31 and from there via a line 32 to a second signal output 33 of the digital phase-locked loop 1 according to the invention. The output clock signal generated is furthermore fed via a line 34 to a signal input 35 of a feedback frequency divider 36. The feedback frequency divider 36 divides the frequency of the output clock signal that is present with an adjustable frequency division ratio k in order to generate a feedback clock signal, which is emitted by the feedback frequency divider 36 via a signal output 37 and a line 38 to the second signal input 8 of the phase detector 6. The feedback frequency divider 36 is likewise a counter in a preferred embodiment.

The digital phase deviation signal D generated by the counter 13 is fed via data lines 39 to a data input 40 of a reset circuit 41 integrated in the digital phase-locked loop 1 according to the invention. The reset circuit 41 has a signal input 42, which is connected to the line 9 via a line 43 at a branching node 44.

Consequently, at its signal input 42, the reset circuit 41 receives the reference clock signal having the frequency $f_{ref}$ which is present at the input 3 of the digital phase-locked loop 1. Furthermore, the reset circuit 41 has a setting terminal 45, which is connected to the setting input 5 of the digital phase-locked loop 1 via a line 46. A threshold value can be set via the setting terminal 5. The reset circuit 41 furthermore has a signal output 47, which is connected to the signal input 49 of a logic OR circuit 50 via a line 48. The logic OR circuit 50 has a second signal input 51, which is connected to the reset terminal 4 of the digital phase-locked loop 1 via a reset line 52. The integrated reset circuit 41 has a reset terminal 53, which is connected via a line 54 to a branching node 55.

The logic OR circuit 50 has a signal output 56, which is connected via a reset line 57 to reset terminals 58, 59, 60, 61 of the counter 13, of the lock detection circuit 18, of the digital low-pass filter 24 and of the feedback frequency divider 36. The counter 13, the lock detection circuit 18, the digital low-pass filter 24 and also the feedback frequency divider 36 are reset if the reset circuit 41 emits a reset signal to the first input 49 of the logic OR gate 50 or the logic OR gate 50 receives, at the second signal input 51, a global reset signal which is applied to the signal input 4 of the digital phase-locked loop 1. The global reset signal is generated when the digital phase-locked loop 1 is switched on. The digital counter 13, the lock detection circuit 18, the digital low-pass filter, the feedback frequency divider 36 and also the reset circuit 41 are reset, i.e. put into a defined state, by the global reset signal.

The integrated reset circuit 41 emits a reset signal via its signal output 47 if the digital phase deviation signal present at the digital data input 40 exceeds an adjustable digital threshold value. The digital threshold value can preferably be set externally via the setting terminal 45.

Figure 3:
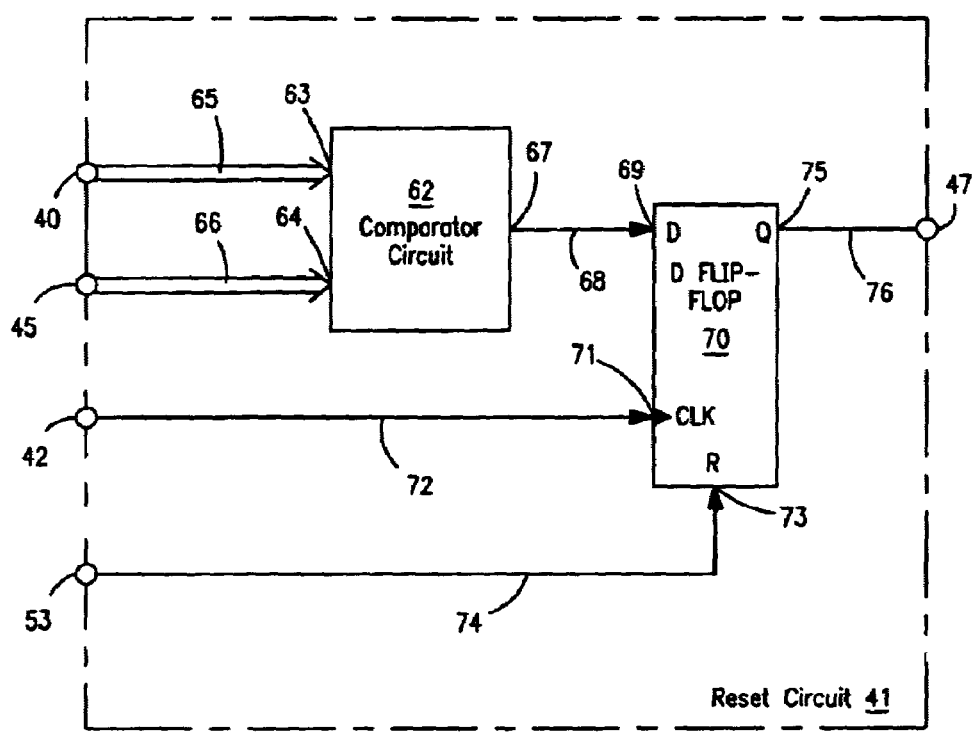
FIG. 3 shows a particularly preferred embodiment of the reset circuit contained in the digital phase-locked loop according to the invention.

FIG. 3 shows a preferred embodiment of the reset circuit 41. The reset circuit 41 contains a comparator circuit 62 having a first signal input 63 and a second signal input 64. The signal input 63 is connected via lines 65 to the signal input 40 of the reset circuit 41 for the reception of the digital phase deviation value D generated by the counter 13. The second signal input 64 of the comparator circuit 62 is connected via lines 66 to the setting terminal 45. The comparator circuit 62 compares the digital phase deviation signal D present at the signal input 63 with a digital threshold value SW set and emits a logical comparison signal via a signal output 67 and a line 68 to a data input 69 of an edge-triggered D flip-flop 70. The edge-triggered D flip-flop 70 has a clock input 71, which is connected to the signal input 42 of the reset circuit 41 via a line 72. The edge-triggered D flip-flop 70 thus receives the reference clock signal at its clock input 71. The D flip-flop 70 furthermore contains a reset terminal 73, which is connected to the reset terminal 53 of the reset circuit 41 via a line 74. Furthermore, the D flip-flop 70 has a digital data output 75, which is connected to the data output 47 of the reset circuit 41 via a line 76.

The method of operation of the digital phase-locked loop 1 as illustrated in FIGS. 2 and 3 is described below.

After the digital phase-locked loop 1 has been switched on, it receives a global reset signal via the global reset terminal 4, by means of which the digital counter 13, the lock detection circuit 18, the digital low-pass filter 24, the feedback frequency divider 36 and the reset circuit 41 are reset. The reference clock signal having the frequency $f_{ref}$ which is present at the reference clock signal terminal 3 and the output clock signal—emitted at the signal output 33—of the digital phase-locked loop 1 are initially asynchronous after the switch-on, with the result that the phase detector 6 detects a phase deviation $\Delta\Phi$ between the feedback clock signal present at the input 8 and the reference clock signal present at the input 7.

In accordance with the detected phase deviation $\Delta\Phi$, the phase detector 6 emits a counter control signal to the up/down counter 13, which emits a digital data value D corresponding to the phase deviation $\Delta\Phi$ to the data output 15. At the beginning of the control operation, the phase deviation $\Delta\Phi$ and thus the digital data value D are relatively high, with the result that the digital threshold value SW set in the comparator circuit 62 of the reset circuit 41 is exceeded. The integrated reset circuit 41 holds the counter 13, the lock detection circuit 18, the digital low-pass filter 24 and the feedback frequency divider in the reset state until the next signal edge of the reference clock signal occurs at the clock input 71 of the D flip-flop 70. The signal edge may be a rising or a falling signal edge, depending on the implementation of the flip-flop 70. The reset operation has reset the counter 13, with the result that the counter outputs a digital phase deviation of zero at the output 15. The comparator circuit 62 recognizes that the phase deviation $\Delta\Phi$ lies below the threshold value SW set, and emits a logic zero, for example, to the data input 69 of the D flip-flop 70. With the reference clock signal edge that occurs, the logic zero present at the input 69 of the flip-flop is taken over by the data output 75 of the flip-flop, with the result that a logic zero is present at both inputs 49, 51 of the OR gate 50. The OR gate 50 emits the logical zero via the reset line 57 to the reset terminals 58, 59, 60, 61 of the counter 13, lock detection circuit 18, digital low-pass filter 24 and feedback frequency divider 36 in order to deactivate the reset state. The reset state caused by the global reset signal is thus deactivated by the integrated reset circuit 41 when the next signal edge of the reference clock signal occurs. The feedback frequency divider 36 thus starts almost synchronously with the reference clock signal, with the result that the transient recovery duration $T_{tr}$ of the digital phase-locked loop 1 in the event of transient recovery from the reset state is very short.

Figure 1:
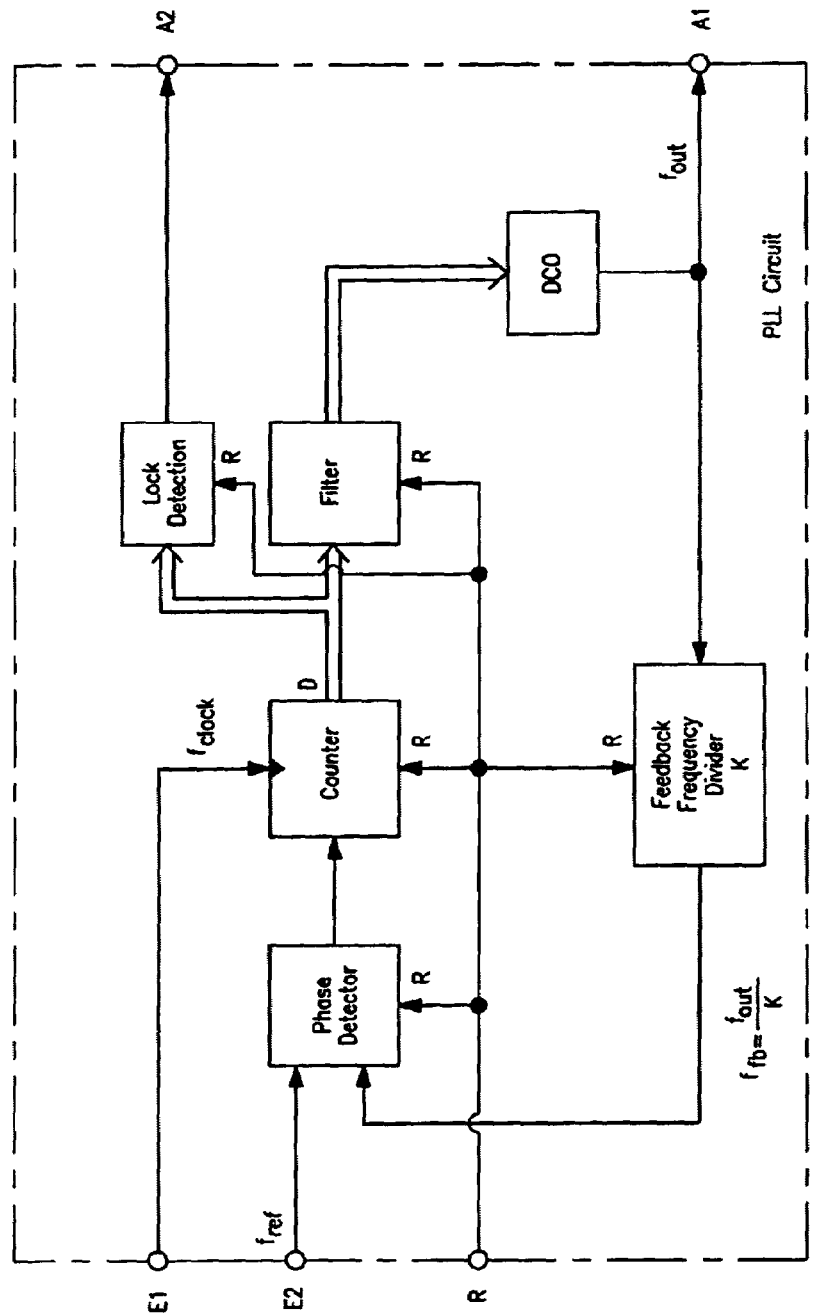
FIG. 1 shows a digital phase-locked loop according to the prior art.

Given a maximum possible phase deviation $\Delta\Phi_{max}$ of 180° between the reference clock signal and the feedback clock signal at the beginning of the transient process, a counter clock signal of about 100 MHz, a reference clock signal of a few kHz, a frequency division ratio k of 1024, a maximum oscillator frequency of the DCO oscillator 28 of 8.19268 MHz and a minimum oscillator frequency of 8.19147 MHz, the transient recovery duration $T_{tr}$ of the phase-locked loop 1 according to the invention, as is illustrated in FIG. 2, is about 2 ms. Consequently, compared with the convention phase-locked loop, as is illustrated in FIG. 1, the transient recovery duration $T_{tr}$ of the phase-locked loop 1 according to the invention is approximately a factor of 100 shorter than the transient recovery duration of the conventional phase-locked loop illustrated in FIG. 1. The transient recovery duration $T_{tr}$ depends on the phase deviation $\Delta\Phi$ at the beginning of the control operation, the frequency division ratio k of the feedback frequency divider 36 and the frequency pulling range of the DCO oscillator 28. In this case, the transient recovery duration $T_{tr}$ increases with increasing initial phase deviation $\Delta\Phi$ and with increasing feedback frequency division ratio k. The higher the frequency pulling range $\Delta f$ of the DCO oscillator 28, the shorter the transient recovery duration. The improvement of the transient recovery duration $T_{tr}$ of the digital phase-locked loop 1 on account of the reset circuit 41 it greater, the larger the frequency division ratio k and the smaller the frequency pulling range of the DCO oscillator 28.

List of Reference Symbols
1 Digital phase-locked loop
2 Counter clock input
3 Reference signal input
4 Global reset terminal
5 Setting terminal
6 Phase detector
7 Input
8 Input
9 Line
10 Output
11 Line
12 Input
13 Counter
14 Clock input
15 Clock line
16 Data lines
17 Input
18 Lock detection circuit
19 Output
20 Line
21 Output
22 Lines
23 Input
24 Digital filter
25 Output
26 Lines
27 Input
28 Oscillator circuit
29 Output
30 Line
31 Branching node
32 Line
33 Output
34 Line
35 Input
36 Feedback Frequency divider
37 Output
38 Line
39 Lines
40 Input
41 Reset circuit
42 Input
43 Line
44 Node
45 Input
46 Line
47 Output
48 Line
49 Input
50 OR gate
51 Input
52 Line
53 Input
54 Line
55 Node
56 Output
57 Line
58 Reset input
59 Reset input
60 Reset input
61 Reset input
62 Comparator circuit
63 Input
64 Input
65 Lines
66 Lines
67 Output
68 Line
69 Data input
70 Flip-flop
71 Clock input
72 Clock line
73 Reset input
74 Line
75 Data output
76 Line

What is claimed is:

1. A digital phase-locked loop having a minimal transient recovery time for emitting an output clock signal which is synchronous with a reference clock signal in a normal operating state of the digital phase-locked loop, the digital phase-locked loop having:

(a) a phase detector for identifying a phase deviation $\Delta\Phi$ between the reference clock signal and a feedback clock signal;
    (b) a resettable counter, which generates a digital phase deviation signal corresponding to the identified phase deviation $\Delta\Phi$;
    (c) a resettable digital filter for filtering the digital phase deviation signal generated;
    (d) a digitally controlled oscillator circuit for generating the output clock signal as a function of a filtered digital phase deviation signal;
    (e) a resettable feedback frequency divider which divides the output clock signal for generating the feedback clock signal with an adjustable frequency division ratio;

characterized by an integrated reset circuit, which resets the counter, the digital filter and the feedback frequency divider as long as the digital phase deviation signal exceeds an adjustable digital threshold value.

2. The digital phase-locked loop as claimed in claim 1, wherein the reset circuit deactivates a reset state—caused by a global reset signal—of the counter, of the digital filter and of the feedback frequency divider when a signal edge of the reference clock signal occurs.

3. The digital phase-locked loop as claimed in claim 2, wherein the signal edge is a rising or falling signal edge of the reference clock signal.

4. The digital phase-locked loop as claimed in claim 1, wherein the counter, the digital filter and the feedback frequency divider are put into a reset state by a global reset signal when the digital phase-locked loop is switched on.

5. The digital phase-locked loop as claimed in claim 1, wherein the integrated reset circuit is reset by a global reset signal.

6. The digital phase-locked loop as claimed in claim 1, wherein the reset circuit has a digital comparator circuit for comparing the digital phase deviation signal with the digital threshold value set.

7. The digital phase-locked loop as claimed in claim 6, wherein the reset circuit has an edge-triggered flip-flop with a data input, which is connected to the digital comparator circuit, a clock input for receiving the reference clock signal, and a reset input for receiving the global reset signal, and with a data output.

8. The digital phase-locked loop as claimed in claim 7, wherein an OR gate is provided, having a first input, which is connected to the data output of the edge-triggered flip-flop, a second input, which is connected to the reset input of the digital phase-locked loop for receiving the global reset signal, and having an output, which is connected to the reset signal terminals of the counter, of the digital filter and of the feedback frequency divider.

9. The digital phase-locked loop as claimed in claim 8, wherein a resettable lock detection circuit is provided, which indicates the end of a transient process by emitting a logical indication signal if the digital phase deviation signal becomes zero.

10. The digital phase-locked loop as claimed in claim 9, wherein the resettable lock detection circuit has a reset signal terminal, which is connected to the output of the OR gate.

11. The digital phase-locked loop as claimed in 1, wherein a reference clock generator for generating the reference clock signal is provided.

12. The digital phase-locked loop as claimed in claim 1, wherein the digital filter is a digital low-pass filter.

13. The digital phase-locked loop as claimed in claim 12, wherein the digital low-pass filter is a digital IIR low-pass filter.

14. The digital phase-locked loop as claimed in claim 1, wherein the counter is clocked by a high frequency clock counter signal.

* * * * *